(12) United States Patent
Chan et al.

(10) Patent No.: US 8,456,408 B2
(45) Date of Patent: Jun. 4, 2013

(54) SHIFT REGISTER

(75) Inventors: Chien-Ting Chan, Changhua County (TW); Hsi-Rong Han, Taichung County (TW); Wen-Chun Wang, Taichung (TW)

(73) Assignee: Wintek Corporation, Taichung (TW)

( * ) Notice: Subject to any disclaimer, the term of this patent is extended or adjusted under 35 U.S.C. 154(b) by 942 days.

(21) Appl. No.: 12/500,803

(22) Filed: Jul. 10, 2009

(65) Prior Publication Data

US 2010/0007598 A1    Jan. 14, 2010

(30) Foreign Application Priority Data

Jul. 11, 2008    (TW) .................................. 97126488 A

(51) Int. Cl.
*G09G 3/36*    (2006.01)

(52) U.S. Cl.
USPC .......................................... 345/100; 345/204

(58) Field of Classification Search
USPC .................................................. 345/100, 204
See application file for complete search history.

(56) References Cited

U.S. PATENT DOCUMENTS

| 7,420,402 | B2 | 9/2008 | Washio et al. |
| 2007/0197019 | A1 * | 8/2007 | Kang et al. .................... 438/620 |

FOREIGN PATENT DOCUMENTS

| TW | 200527818 | 8/2005 |
| TW | 200614131 | 5/2006 |
| TW | 200727232 | 7/2007 |

OTHER PUBLICATIONS

Taiwanese language office action dated Aug. 29, 2012.
English language translation of abstract of TW 200527818 (published Aug. 16, 2005).
English language translation of abstract of TW 200614131 (published May 1, 2006).
English language translation of abstract of TW 200727232 (published Jul. 16, 2007).

* cited by examiner

*Primary Examiner* — Amare Mengistu
*Assistant Examiner* — Jennifer Zubajlo
(74) *Attorney, Agent, or Firm* — McClure, Qualey & Rodack, LLP

(57) ABSTRACT

A shift register includes multiple stages each generating a scan signal at an output terminal and including a level pull-up circuit, a level pull-down circuit, a driving circuit and a level controlling circuit. The level pull-up circuit makes the scan signal equal a first clock signal in response to an enabled level of a first control signal. The level pull-down circuit makes the scan signal equal a first voltage in response to an enabled level of a second control signal. The driving circuit controls the first control signal to be the enabled level and a disabled level in response to an enabled level of an input signal and the enabled level of the second control signal, respectively. The level controlling circuit controls the second control signal to be the disabled level and the enabled level in response to the enabled level and the disabled level of the input signal, respectively.

10 Claims, 5 Drawing Sheets

SHIFT REGISTER

This application claims the benefit of Taiwan application Serial No. 97126488, filed Jul. 11, 2008, the subject matter of which is incorporated herein by reference.

BACKGROUND OF THE INVENTION

1. Field of the Invention

The invention relates in general to a shift register, and more particularly to a shift register having a level controlling circuit capable of performing a level control operation via the charge storing ability of a capacitor.

2. Description of the Related Art

In the modern age, in which the technology changes with each passing day, liquid crystal displays have been widely applied to electronic display products, such as a television, a computer screen, a notebook computer, a mobile phone or a personal digital assistant. The liquid crystal display includes a data driver, a scan driver and a liquid crystal display panel, which has a pixel array. The scan driver sequentially turns on the corresponding pixel row in the pixel array and thus transfers the pixel data, outputted from the data driver, to the pixels so that the image can be displayed.

In the current technology, a shift register is often used to implement the scan driver capable of sequentially turning on the corresponding pixel row in the pixel array. FIG. 1 (Prior Art) is a circuit diagram showing a conventional shift register unit. Referring to FIG. 1, a shift register unit SR(n) generates a level control signal VC(n) by way of boot-strapping. The level of the control signal VC(n) is substantially greater than or equal to the level (VDD-Vth), wherein the level VDD is a high voltage level of the shift register unit SR(n), and Vth is the threshold voltage of a transistor TA, for example. The transistor TA outputs a high level clock signal CKZ as a scan signal SC(n) in response to the control signal VC(n), wherein the high level of the clock signal CKZ is equal to the voltage level VDD.

However, the conventional shift register unit SR(n) controls the operations of the transistors TA and TB according to the control signal VC(n). Thus, the circuit load to be driven by the control signal VC(n) is higher so that the level of the control signal VC(n) is lower. For example, the level of the control signal VC(n) is lower than the level (VDD-Vth). Consequently, the level of the scan signal SC(n) is substantially lower than the high voltage level VDD to cause the too low level of the scan signal SC(n) and thus deteriorate the frame display quality of the liquid crystal display.

In addition, the width-to-length ratio of the transistor TB is equal to about ten times of the width-to-length ratio of the transistor TC, and the transistor TC is biased as a diode. Consequently, an inverter INV formed by the transistors TC and TB may generate an output signal Vg, which is an inverse of the control signal VC(n), in response to the control signal VC(n). However, because the transistor TC has the smaller width-to-length ratio, the transistor TC needs to withstand the higher current, generated by the transistor TA, when the transistor TC is turned on. Consequently, the transistor TC may be damaged to cause the shift register unit to generate the malfunction and to shorten the lifetime of the liquid crystal display. Thus, it is an important direction in the industry to design a level controller and a shift register each having a long lifetime, and thus to lengthen the lifetime of the liquid crystal display and enhance the frame quality thereof.

SUMMARY OF THE INVENTION

The invention is directed to a shift register. Compared with the conventional shift register, the shift register of the invention can reduce the circuit load to be driven by a control signal VC(n), shorten the time for converting the level of the control signal VC(n), prevent the error of the level of a scan signal SC(n) from occurring due to the too long level conversion time of the control signal VC(n), lengthen the lifetime of the shift register and thus make the liquid crystal display applying the shifter register of the invention have the better frame display quality.

According to the present invention, a shift register including multiple stages of shift register units is provided. Each of the stages of shift register units generates multiple scan signals via an output terminal and includes a level pull-up circuit, a level pull-down circuit, a driving circuit and a level controlling circuit. The level pull-up circuit controls the scan signal to be equal to a first clock signal in response to an enabled level of a first control signal. The level pull-down circuit controls the scan signal to be equal to a first voltage in response to an enabled level of a second control signal. The driving circuit controls the first control signal to have the enabled level and a disabled level in response to an enabled level of an input signal and the enabled level of the second control signal, respectively. The level controlling circuit controls the second control signal to have the disabled level and the enabled level in response to the enabled level and the disabled level of the input signal, respectively.

The invention will become apparent from the following detailed description of the preferred but non-limiting embodiments. The following description is made with reference to the accompanying drawings.

DETAILED DESCRIPTION OF THE INVENTION

In the shift register according to each embodiment of the invention, each stage of shift register unit uses an input signal to drive a transistor in the each stage of shift register unit. The transistor in the each stage of shift register unit may be an amorphous silicon thin film transistor (Amorphous TFT), a poly-silicon thin film transistor (Poly-silicon TFT) or an N-type metal-oxide semiconductor (NMOS).

Figure 1:
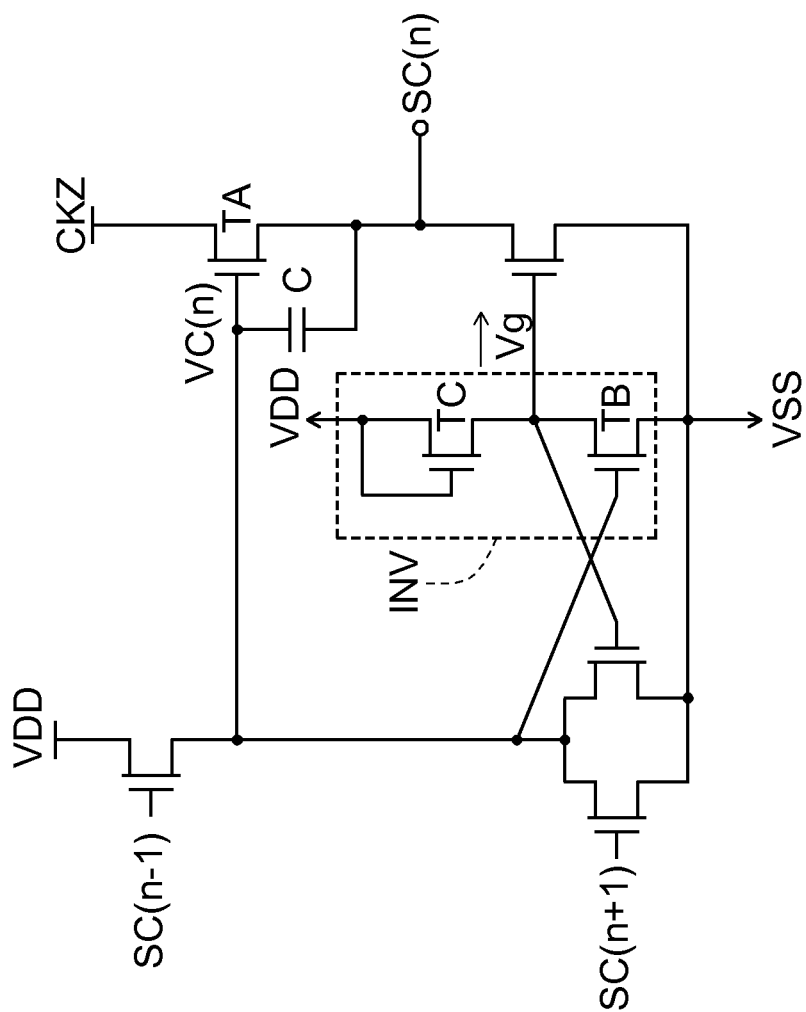
FIG. 1 (Prior Art) is a circuit diagram showing a conventional shift register unit.
Figure 2:
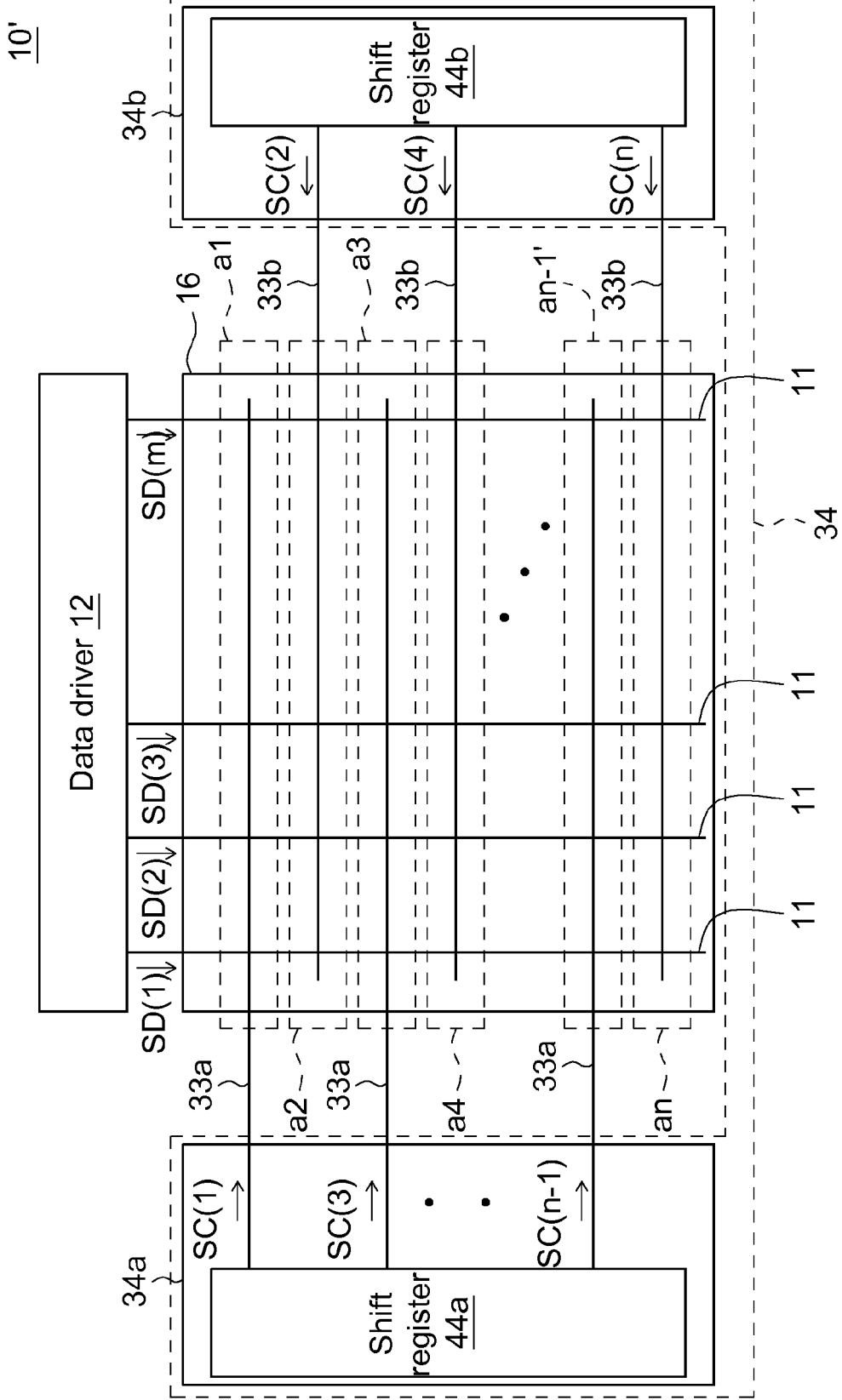
FIG. 2 is a block diagram showing a liquid crystal display according to an embodiment of the invention.

The shift register of the embodiment is applied to the single-side scan driver. FIG. 2 is a block diagram showing a liquid crystal display 10' according to the embodiment of the invention. Referring to FIG. 2, the difference between the liquid crystal display 10' of the embodiment and the liquid crystal display 10 of the embodiment is that the scan driver 14 of the embodiment is replaced with a scan driver 34. The scan driver 34 is a double-side scan driver, which includes odd-numbered and even-numbered scan drivers 34a and 34b.

The odd-numbered scan driver 34a provides the odd-numbered scan signals SC(1), SC(3), . . . , SC(n−1) to the display panel 16 through the scan line 33a; and the even-numbered scan driver 34b provides the even-numbered scan signals SC(2), SC(4), . . . , SC(n) to the display panel 16 through the scan line 33b, wherein n is an even number, for example. The odd-numbered and even-numbered scan drivers 34a and 34b respectively include shift registers 44a and 44b. The shift registers 44a and 44b have substantially similar structures and operations. In the following, only the structure and the operation of the shift register 44a are illustrated, and the structure and the operation of the shift register 44b may be derived according to the description associated with the shift register 44a.

Figure 3:
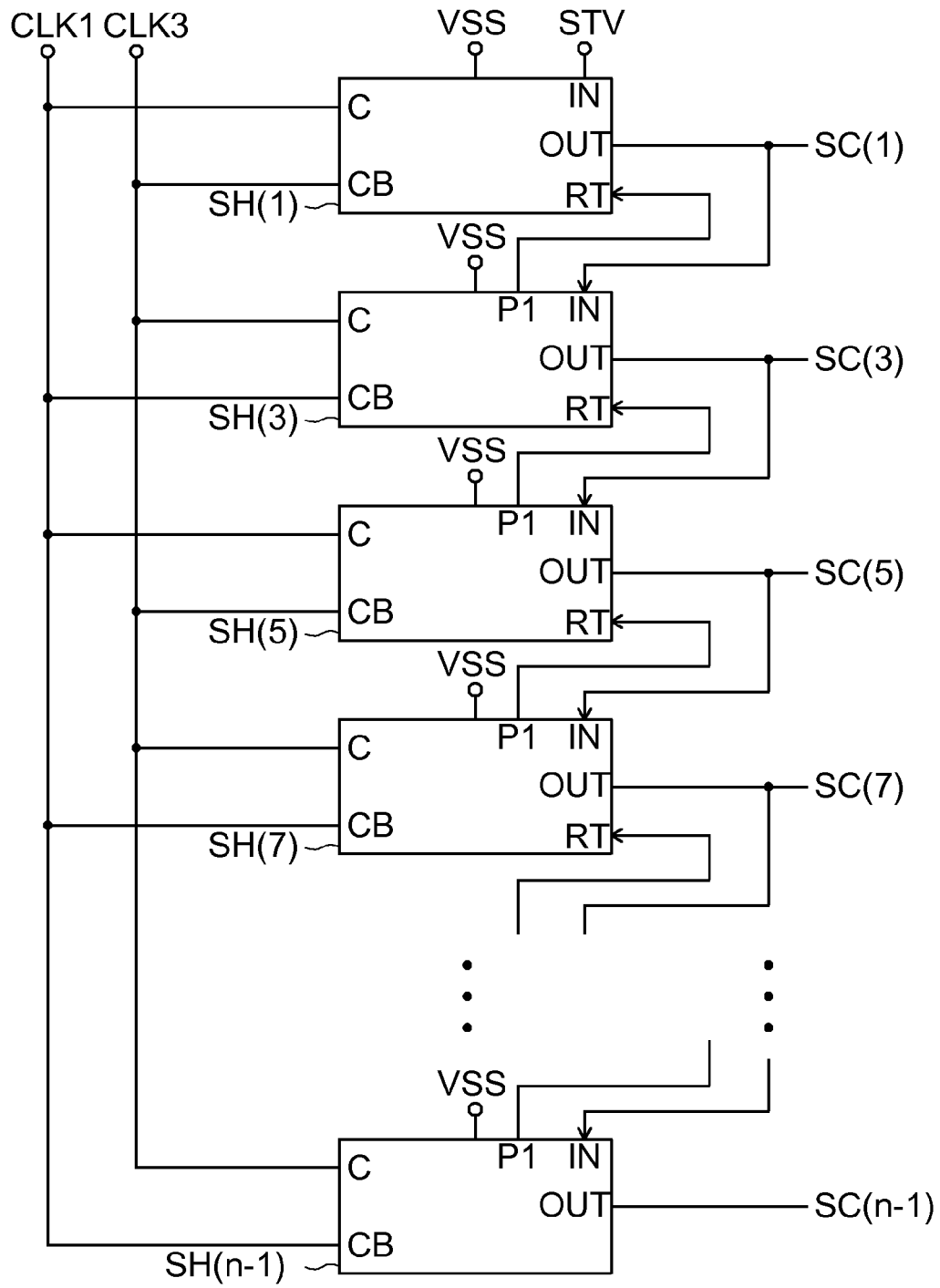
FIG. 3 is a block diagram showing the shift register according to the embodiment of the invention.

FIG. 3 is a block diagram showing the shift register according to the embodiment of the invention. Referring to FIG. 3, the shift register 44a includes odd-numbered shift register units SH(1), SH(3), SH(5), . . . , SH(n−1) in the scan driver 34, wherein the shift register units SH(1) to SH(n−1) are for respectively outputting the odd-numbered scan signals SC(1) to SC(n−1), for example.

The clock terminals C1 of the shift register units SH(1), SH(5), SH(9), . . . , SH(n−3) in the shift register units SH(1) to SH(n−1) receive the clock signal CLK1, wherein the clock terminals C1 of the shift register units SH(3), SH(7), SH(11), . . . , SH(n−1) receive the clock signal CLK3. The control terminals RT of the shift register units SH(1) to SH(n−3) respectively receive the voltage signals of the nodes P1 of the shift register units SH(3) to SH(n−1) serving as the control signals Vc1(1) to Vc1(n−1). The shift register units SH(1) to SH(n−1) have, for example, similar structures and operations. In the following, the operations of the shift register units SH(1) to SH(n−1) will be illustrated by taking the $i^{th}$ shift register unit SH(i) in the shift register units SH(1) to SH(n−1) as an example, wherein i is an odd number smaller than or equal to (n−1).

Figure 4:
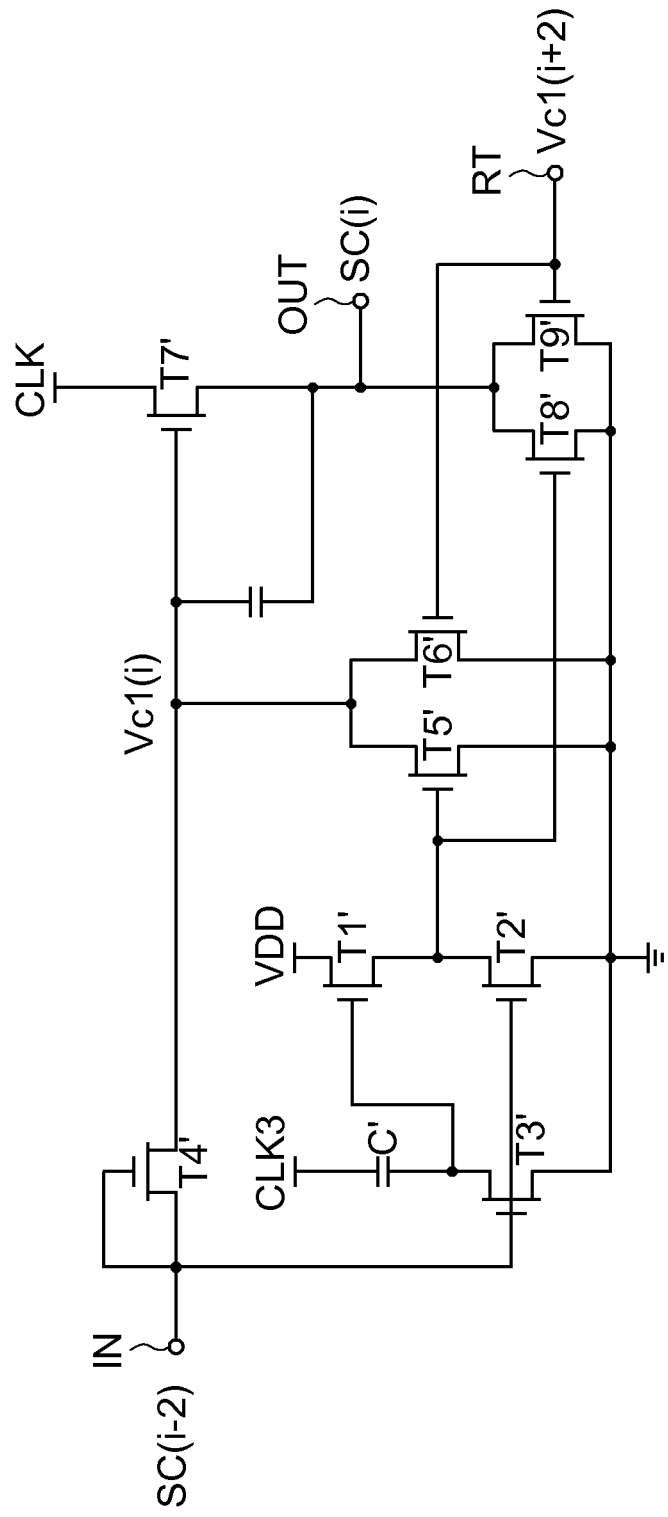
FIG. 4 is a detailed circuit diagram showing the $i^{th}$ stage of shift register unit SH(i) in FIG. 2.
Figure 5:
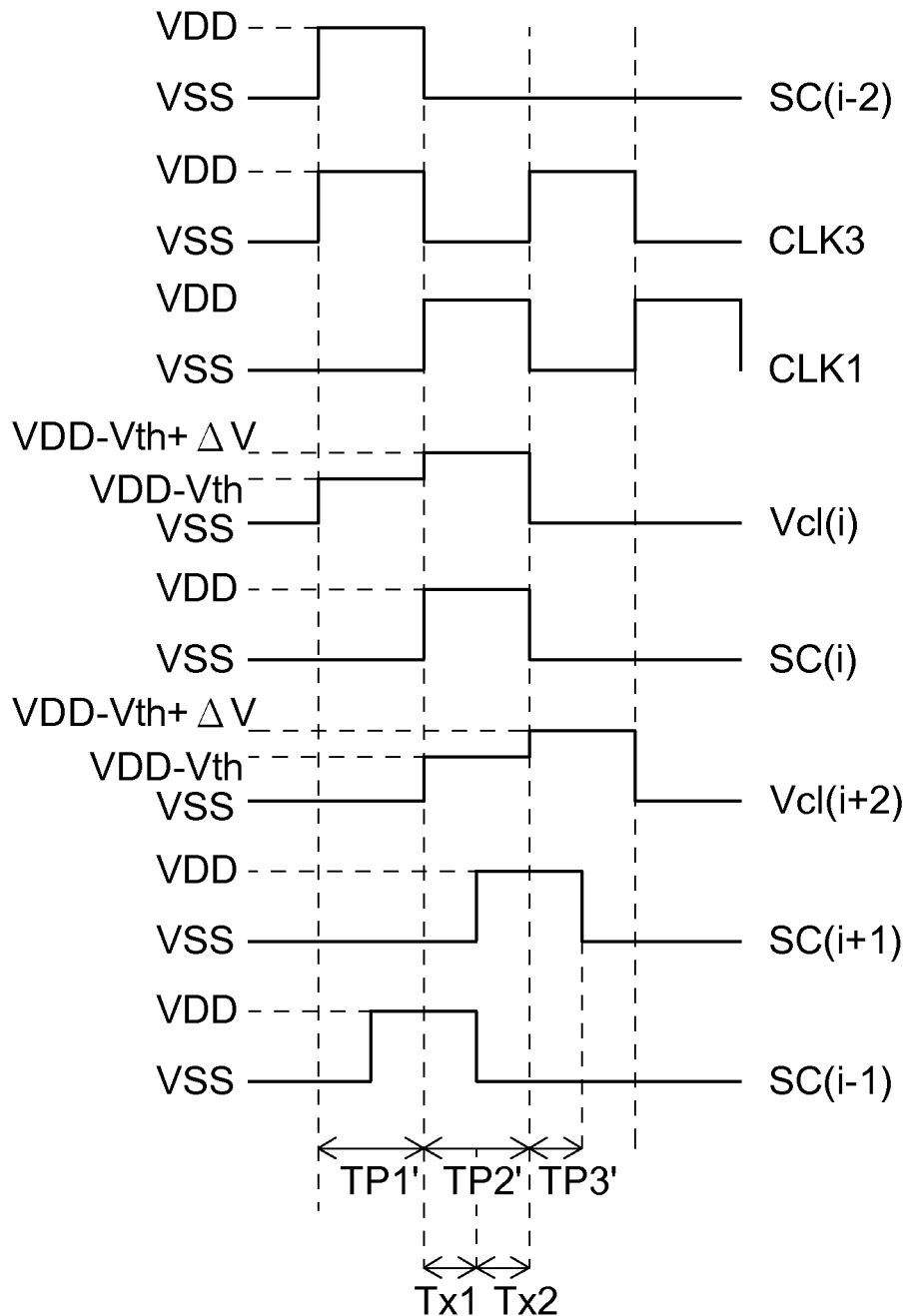
FIG. 5 shows associated signal timings in FIG. 3.

FIG. 4 is a detailed circuit diagram showing the $i^{th}$ stage of shift register unit SH(i) in FIG. 2. FIG. 5 shows associated signal timings in FIG. 3. The difference between the shift register unit SH(i) of this embodiment and the shift register unit S(j) of the embodiment is that the input terminal IN of the shift register unit SH(i) of the embodiment receives the input signal, which is the scan signal SC(i−2), and the control terminal RT receives the control signal Vc1(i+2).

The difference between the shift register unit SH(i) and the shift register unit S(j) of the embodiment is that the time, for which the clock signals CLK1 and CLK3 are kept at the high level, is substantially equal to twice the time, for which the clock signals CLK and CLKB received by the shift register unit S(j) are kept at the high level. Thus, the shift register unit SH(i) respectively performs the operations, which are performed by the shift register unit S(j) in the time periods TP1 and TP2, in the time periods TP1' and TP2' substantially having the doubled time lengths. In the time period TP3', the shift register unit SH(i) performs the operation, which is performed by the shift register unit S(j) in the time period TP3, in response to the high level of the control signal Vc1(i+2).

According to the description of the operation of the shift register unit SH(i) in the embodiment of FIGS. 4 and 5, the time, for which the scan signal SC(i) of this embodiment is kept at the high level, is substantially increased to be twice the time, for which the corresponding scan signal SC(j) of the embodiment is kept at the high level, and the time, in which the scan signal SC(i) is kept at the high level, is respectively overlapped with the times, in which the scan signals SC(i+1) and SC(i−1) are kept at the high levels. For example, the scan signal SC(i) and the scan signal SC(i+1) are turned on in the rear half period T×2 of the time period TP2', and the scan signal SC(i) and the scan signal SC(i−1) are turned on in the front half period T×1 of the time period TP2'. Thus, it is obtained that the liquid crystal display 10' of this embodiment is substantially a liquid crystal display having the function of pre-charging the liquid crystal capacitor.

In the time period TP2', for example, the $i^{th}$ row of pixels a(i) and the $(i−1)^{th}$ row of pixels a(i−1) in the display panel 16 are respectively turned on in response to the scan signals SC(i) and SC(i−1). At this time, m sets of first data outputted from the data driver 12 are the data to be written into m pixels in the $(i−1)^{th}$ row of pixels a(i−1). As for the $i^{th}$ row of pixels a(i), the m sets of first data are pre-charge data for pre-charging the pixel capacitors of m pixels of the $i^{th}$ row of pixels a(i).

In the period T×2, the $(i+1)^{th}$ row of pixels a(i+1) and the $i^{th}$ row of pixels a(i) in the display panel 16 are respectively turned on in response to the scan signals SC(i+1) and SC(i). At this time, the data driver 12 outputs m sets of second data as the data to be written into the m pixels of the $i^{th}$ row of pixels a(i). At this time, the m pixels in the $i^{th}$ row of pixels a(i) respectively store the m sets of second data, and display the corresponding image frame. As for the $(i+1)^{th}$ row of pixels a(i+1), the m sets of second data are pre-charge data for pre-charging pixel capacitors of m pixels in the (i+1)th row of pixels a(i+1).

According to the operation mentioned hereinabove, the m pixels in each row of pixels of this embodiment can respectively perform the operations of pre-charging the pixel capacitors according to m sets of data to be written into m pixels of the previous row of pixels.

In this embodiment, illustrations are made only according to the operation of the $i^{th}$ stage of shift register unit SH(i) in the shift register units SH(1) to SH(n−1). However, the structures and operations of other stages of shift register units of the shift register 44a may be derived according to the descriptions associated with the shift register unit SH(i). The operation of each stage of shift register unit in the shift register 44b may be derived according to the operation of the shift register unit SH(i) in the shift register 44a.

In this illustrated embodiment, the transistors T6' and T9' of the shift register unit SH(i) pull down the control signal Vc1(i) and the scan signal SC(l) in response to the control signal Vc1(i+2). However, the operations of the transistors T6' and T9' are not limited to the operation performed in response to the control signal Vc1(i+2).

In this illustrated embodiment, the shift register unit SH(i) includes transistors T1' and T2'. However, the circuit of the shift register unit SH(i) is not limited thereto. For example, the transistors T1' and T2' of the shift register unit SH(i) may be omitted, and the operations of transistors T5' and T6' may be directly controlled according to the control signal Vc3(i).

Similar to the shift register of the embodiment, the shift register of this embodiment can effectively reduce the circuit load driven by the specific control signal in each stage of shift register unit, shorten the time for controlling the signal level conversion, prevent the level of each corresponding scan signal from having the error due to the too long level conversion time of the control signal, and make the liquid crystal display applying the shift register of the invention have the better frame display quality.

In addition, the shift register of this embodiment also has the advantages that the transistors of the level controlling circuit have the matched sizes, that the transistor cannot be easily damaged, that the shift register unit cannot easily have the malfunction and that the liquid crystal display using the same has the longer lifetime and the better frame display quality.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A shift register applied to a double-side scan driver of a display panel, the shift register comprising a plurality of odd numbered stages of shift register units and a plurality of even numbered stages of shift register units, which are respectively disposed on two opposite sides of the display panel, wherein an $n^{th}$ stage of shift register unit in the shift register units generates a scan signal via an output terminal, wherein n is a natural number, and the $n^{th}$ stage of shift register unit comprises:
   a level pull-up circuit for making the scan signal be equal to a first clock signal in response to an enabled level of a first control signal;
   a level pull-down circuit for making the scan signal be equal to a first voltage in response to an enabled level of a second control signal;
   a driving circuit for controlling the first control signal to be the enabled level in response to an enabled level of an input signal, and controlling the first control signal to be a disabled level in response to the enabled level of the second control signal; and
   a level controlling circuit for controlling the second control signal to be a disabled level in response to the enabled level of the input signal, and controlling the second control signal to be the enabled level in response to a disabled level of the input signal.

2. The shift register according to claim 1, wherein the level controlling circuit comprises:
   a node having a voltage being the second control signal;
   a charge storing circuit having one terminal for receiving a second clock signal, and the other terminal coupled to the node, wherein the charge storing circuit stores a voltage between the level of the second clock signal and the level of the voltage on the node; and
   a first transistor having a gate for receiving the input signal, a first source/drain coupled to the node, and a second source/drain for receiving the first voltage, wherein the first transistor provides the first voltage to the node to disable the second control signal in response to the enabled level of the input signal.

3. The shift register according to claim 1, wherein the level controlling circuit comprises:
   a first node and a second node having voltages being a third control signal and the second control signal, respectively;
   a charge storing circuit having one terminal for receiving a second clock signal, and the other terminal coupled to the first node, wherein the charge storing circuit stores a voltage between the level of the second clock signal and the level of the voltage on the first node;
   a first transistor having a gate for receiving the input signal, a first source/drain coupled to the first node, and a second source/drain for receiving the first voltage, wherein the first transistor provides the first voltage to the first node to disable the third control signal in response to the enabled level of the input signal;
   a second transistor having a gate for receiving the input signal, a first source/drain coupled to the second node, and a second source/drain for receiving the first voltage, wherein the second transistor provides the first voltage to the second node to disable the second control signal in response to the enabled level of the input signal; and
   a third transistor having a gate coupled to the first node, a first source/drain for receiving a second voltage, and a second source/drain coupled to the second node, wherein the third transistor provides the second voltage to the second node in response to the third control signal and thus enables the second control signal.

4. The shift register according to claim 1, wherein the level pull-down circuit further comprises:
   a fourth transistor having a gate for receiving the first control signal of an $(n+2)^{th}$ stage of shift register unit, a first source/drain coupled to the output terminal and a second source/drain for receiving the first voltage, wherein the fourth transistor controls the scan signal to be equal to the first voltage in response to the enabled level of the first control signal in the $(n+2)^{th}$ stage of shift register unit.

5. The shift register according to claim 1, wherein the driving circuit further comprises:
   a third node having a voltage equal to the first control signal; and
   a fifth transistor having a gate for receiving the first control signal in an $(n+2)^{th}$ stage of shift register unit, a first source/drain coupled to the third node and a second source/drain for receiving the first voltage, wherein the fifth transistor controls the first control signal to be equal to the first voltage in response to the enabled level of the first control signal in the $(n+2)^{th}$ stage of shift register unit.

6. The shift register according to claim 1, wherein the scan signal provided by the double-side scan driver is a pre-charge scan signal.

7. The shift register according to claim 1, wherein the driving circuit comprises:
   a third node having a voltage equal to the first control signal;
   a sixth transistor having a gate and a first source/drain for receiving the input signal, and a second source/drain coupled to the third node; and
   a seventh transistor having a gate for receiving the second control signal, a first source/drain coupled to the third node, and a second source/drain for receiving the first voltage.

8. The shift register according to claim 1, wherein the level pull-up circuit comprises:
   an eighth transistor having a gate for receiving the first control signal, a first source/drain for receiving the first clock signal, and a second source/drain coupled to the output terminal.

9. The shift register according to claim 1, wherein the level pull-down circuit comprises:
   a ninth transistor having a gate for receiving the second control signal, a first source/drain coupled to the output terminal, and a second source/drain for receiving the first voltage.

10. The shift register according to claim 1, wherein the input signal is the scan signal outputted from an $(n-2)^{th}$ stage of shift register unit.

* * * * *